United States Patent [19]

Hollis, Jr. et al.

[11] Patent Number: 4,745,338
[45] Date of Patent: May 17, 1988

[54] ELECTROMAGNETICALLY SUSTAINED PLASMA REACTOR

[75] Inventors: Daniel L. Hollis, Jr., Cottondale; Jerry T. McLendon, Berry, both of Ala.

[73] Assignee: University of Alabama, Tuscaloosa, Ala.

[21] Appl. No.: 854,632

[22] Filed: Apr. 22, 1986

[51] Int. Cl.⁴ ..................... H01J 23/34; H05B 31/26; H05B 7/005
[52] U.S. Cl. ............................. 315/111.71; 315/267; 315/348; 315/111.41; 315/357; 313/146; 313/148; 313/156; 313/161; 313/231.41; 313/244; 313/326; 219/121 P; 219/121 PR; 75/10.2; 373/18; 373/22
[58] Field of Search .......... 75/0.5 B, 0.5 BB, 0.5 BC, 75/10.19, 10.2; 219/121 P, 121 PM, 121 PR; 315/111.21, 111.41, 111.51, 344, 357; 313/325, 231.41, 148, 161, 356, 149, 156; 373/18, 22, 23

[56] References Cited

U.S. PATENT DOCUMENTS

| | | | |
|---|---|---|---|
| 3,521,106 | 7/1970 | Hess | 219/121 P |
| 3,598,944 | 8/1971 | Weimar | 219/121 P X |
| 3,925,177 | 12/1975 | Kofold | 75/0.5 BB X |
| 4,119,876 | 10/1978 | German et al. | 313/231.41 |

*Primary Examiner*—David K. Moore
*Assistant Examiner*—Mark R. Powell
*Attorney, Agent, or Firm*—Oblon, Fisher, Spivak, McClelland & Maier

[57] ABSTRACT

An improved plasma arc reactor is provided with variably positionable electrodes, including a cylindrical anode electrode having an inner, frustoconical cavity providing a reaction chamber and a spherical cathode ball electrode mounted therein. Between these electrodes an arc discharge is induced and sustained to heat and ionize an inert gas to produce an arc plasma for refining raw material introduced into the reaction chamber. A magnetic induction coil is mounted around the outer diameter of the anode electrode to thereby establish a magnetic field to rotate the arc discharge and plasma within the reaction chamber.

13 Claims, 2 Drawing Sheets

ELECTROMAGNETICALLY SUSTAINED PLASMA REACTOR

TECHNICAL FIELD

The present invention relates in general to electrometallurgy and the refining of raw materials. More particularly, the present invention is directed to an improved high-temperature arc-discharge plasma reactor for use in the reduction or processing of complex or difficult-to-reduce minerals.

BACKGROUND OF THE INVENTION

Prior Art

In the ore refining, mineral processing and certain other chemical industries, it is well known that some raw materials are difficult to reduce from their natural state to their constituent elements. One long-known method for reducing these materials is to introduce them into a high-temperature environment for a requisite period of time. To achieve the requisite high temperatures necessary to reduce complex materials, electric current may be converted into high temperature effluents which, by virtue of their high temperature and enthalpy, interact with the raw material, causing a higher rate of reaction than would take place at a lower temperature. Consequently, in the electrometallurgical arts, there are many known electric arc furnaces, including the use of a plasma, to refine materials.

In U.S. Pat. No. 4,394,162, Tylko discloses a plasma reactor wherein an electrical arc discharge is produced between stationary electrode segments or structures and is then pulsated to produce acoustic shock waves or discontinuities which produce a region of plasma in the interelectrode space. The arc discharge is caused to orbit or circulate around the cathode by electromagnetic means.

Another patent which discloses the use of a magnetic field to rotate the plasma is U.S. Pat. No. 3,851,136 (to Venus), but Venus requires stationary, axially spaced electrodes located remote from the magnetic field.

Despite the advances in the metallurgical arts represented by the above-cited prior art patents, many problems remain. For example, the establishment and maintenance of a stable plasma to effect longer retention of the material to be refined, heretofore has been unachieved. Undue electrode contamination and the shortness of electrode life remain a source of inefficiency in plasma reaction chambers, and the short life and damage of furnace or reaction chamber walls or linings due to the discharge arc and high temperatures is yet a severe problem.

DISCLOSURE OF THE INVENTION

It is a major object of the present invention to provide a novel and improved plasma reactor for use in the general field of mineral processing.

A specific object of the present invention is to provide a novel and improved high temperature plasma reactor to effect the chemical dissociation of a pulverated, complex, mineral ore.

Another object of the present invention is to provide a novel and improved plasma reactor wherein a high-temperature, rapidly rotating, stable plasma is rotated by an electromagnetic field generated by a solenoidal coil.

A further object of the present invention is to provide for a plasma reactor, a novel and improved electrode arrangement to permit variable positioning of the electrodes, to increase electrode and reactor component life, and to enable easy and rapid plasma ignition and control.

An additional object of the present invention is to provide an improved plasma reactor whereby the input raw material is retained longer in, and more evenly distributed within, the plasma to thereby enhance the reduction of complex raw material.

These and other objects are achieved, in accordance with the present invention, by providing an electromagnetically sustained plasma reactor having variably positionable electrodes, including a cylindrical anode electrode having an inner, frustoconical cavity providing a reaction chamber and a spherical cathode-ball electrode located therein. Between the electrodes an arc discharge is produced to heat and ultimately ionize an inert gas to produce an arc plasma for the dissociation of material introduced into the reaction chamber for refining. A solenoidal magnetic coil circumferentially surrounds a portion of the cylindrical outer diameter of the anode electrode to thereby establish within the reaction chamber a magnetic field to rotate and sustain the plasma therein.

BACKGROUND THEORY OF INVENTION

Figure 1:
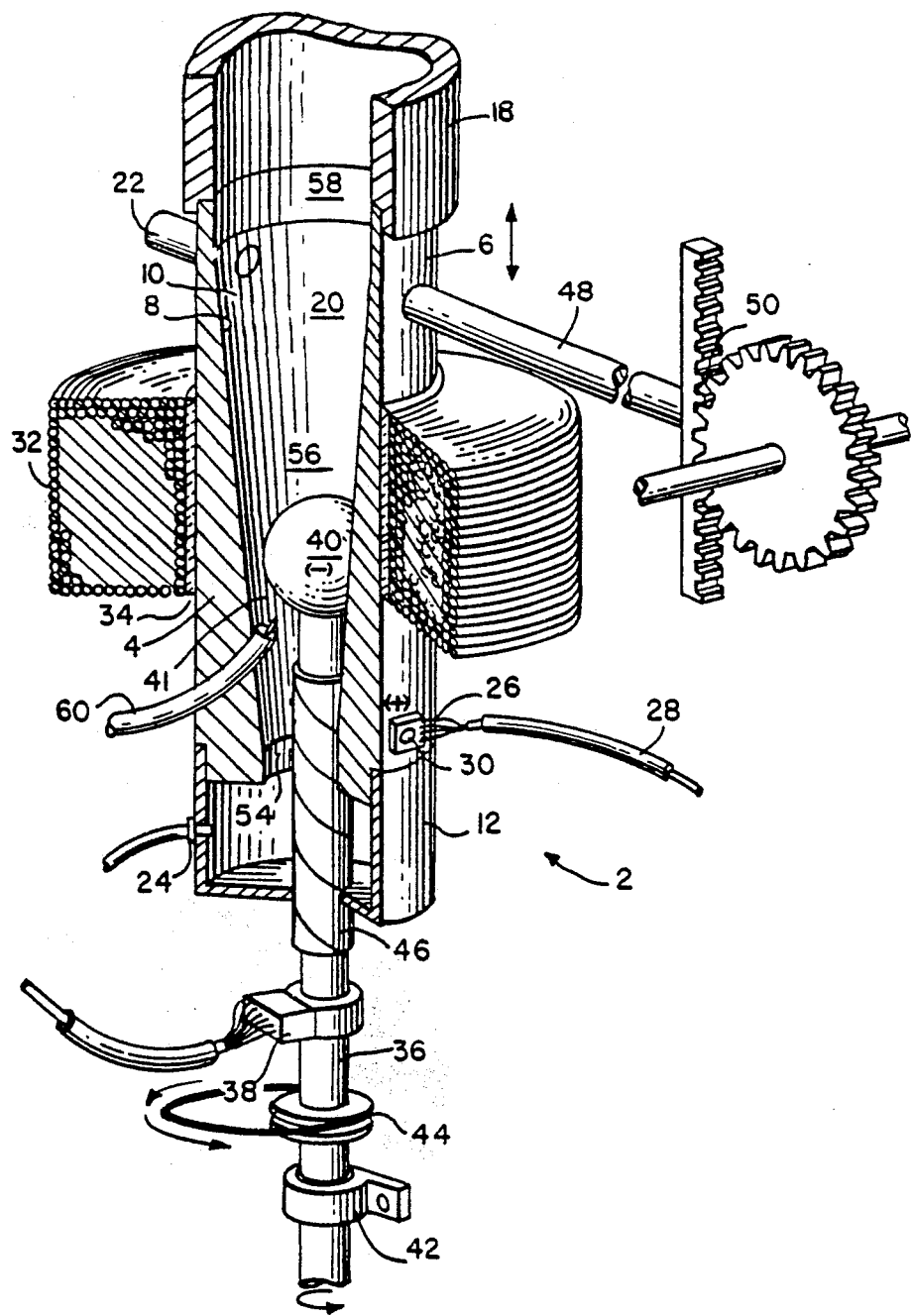
FIG. 1 is a cross sectional view of the electromagnetically sustained plasma reactor of the present invention.

Simply put, a plasma is an ionized gas exhibiting collective properties and consisting of neutral atoms and/or molecules, electrons and ions. One way to achieve the high-temperature plasma conditions of the present invention is through means of an electrical discharge in a suitable gas. By imposing an electrical field across a gas, an arc discharge occurs, and an ionized gas consisting of electron-ion pairs and neutral atoms or molecules is produced.

Generally, an electrical discharge such as that described above can be represented as a thin line or current of electrons and ions. As a result of slight mass, electrons are much more mobile than ions. The electrons respond promptly to an imposed electrical field, and they can gain enough energy to cause more ionizations from their collisions with neutral atoms and molecules. Atomic energies are measured in electron volts (eV), and 1 eV=1.6 ($10^{-19}$)J is the amount of energy gained by an electron subjected to an electrical potential difference of 1 V. 1 eV corresponds to 11,600° K.; therefore, it is to be expected that a thermal collection of ionized gas particles will have a very high temperature. For example, some molecules are dissociated to atoms at temperatures as low as 2,300° K., and ionizations begin near 3,300° K. At about 10,000° K., gases in general are one to two percent ionized. Depending on the degree of ionization, there could be three groups of particles: electrons, ions, and neutral atoms or molecules, each of which groups could have separate and different temperatures. The very light and more mobile electrons initially have a higher temperature than the others and, because of their net electrical charge which makes ions susceptible to electric field excitation, the ion temperature tends to be greater at first than that of neutral atoms or molecules. Collisions among all three groups of particles act to equalize the energy distributions. When the temperatures of the various particles are the same, the collection is classified as an equilibrium plasma. This occurs at or greater than the relatively high pressure of one atmosphere. These are the conditions of the reactor of the present invention and, consequently, its plasma is termed an equilibrium, or thermal, plasma. There are a range of temperatures which are applicable to the arc plasma of this invention. In *Arc Discharge in Inert Gases* [Kolyesnikov, V. N., Tr. Fiz. Inst. Akad., Nauk SSSR, v. 30, 1964, p. 66], electron temperatures $T_e$ and atom temperatures $T_g$ are disclosed as a function of electron concentration. Argon at standard conditions has a number density of 2.6 $(10^{19})$ atoms/cm$^3$. If one percent of the gas is ionized, the free electron concentration is of the order of $10^{17}$ cm$^3$; if only 0.1 percent of the gas is ionized, the free electron concentration is about $10^{16}$ cm$^3$. For both cases, Kolyesnikon indicates that the electron and gas temperatures are the same with values increasing from 8,000° K. to over 10,000° K. Even if the free electron concentration is less than $10^{16}$/cm$^3$, the gas temperature is at least 3,000° K. From this statement it is concluded that center line temperature of the present invention's plasma is probably near 10,000° K. with an ionization of approximately one percent.

The following various factors may influence electric arc discharge and therefore the plasma reactor of the present invention: gas type, pressure, applied electrical field (a.C. or d.c.), geometry of the system, and material of the electrodes. Argon at 760 mm, for example, between parallel electrode plates separated by 0.5 cm., requires about 5,000 V for the d.c. electric field to spark. Static conditions simplify the expression for the electrical field to $$\vec{E} = -\Delta V \approx (V/d)\vec{a}\vec{V}/m \tag{1}$$

where V is the electric potential in volts across the gap distance, d, in meters, and a is the unit vector in the direction of the field. This equation provides a rough estimate of the field. As applied to the cathode-anode separation of about 0.5 cm for the present invention, the electric field across the gap is approximately $$\vec{E} = (V/d)(-\vec{a}_r) = (35/0.005)(-\vec{a}_r) = -7,000\vec{a}_r V/M \tag{2}$$

Some gases ionize more easily than others. Even though the monatomic inert elements (He, Ne, Ar) have the largest ionization energies per atom, they do not need energy for molecular dissociation as do diatomic, and even more complicated, molecules ($H_2$, $O_2$, $N_2$, $CO_2$). For example, the ionization voltage across an electric arc in hydrogen and ammonia is the 120 to 150 V range; for argon, the lowest, it is about 20 V. Inert gases not only require less energy for ionization, they also have the property of not entering into chemical combinations with other atoms to form compounds. Because of these attractive properties, the working gas in the present invention may be argon.

The material of the electrodes has an influence on how an electrical breakdown occurs. For metals like copper, field effect may be the primary mechanism for electron emission. Iron and some other metals release electrons mainly from thermionic emission. The cathode-ball electrode of the present invention, set forth below, may consist of stainless steel. If so, electrons are emitted from it mainly because of the thermionic emission.

Although the impedance across a gas under nonconducting conditions is very high, after electrical breakdown, and the initial phases have passed, the impedance is very low and is mainly resistive. Large currents in a conducting gas may mean more free charge carriers in the gas; for example, a current of 200 amperes to the ionized gas implies that the electron flow rate is $$e_e = (200 C/s)(1e/1.6(10^{-19})C) = 1.2(10^{21})e/s \tag{3}$$

where C is columbs of charge. If this current is supplied, then there is at least the same current in the ionized gas. Free electrons in a gas with an electric field of $-7,000$ V per m at standard pressure (760 mm) have a drift velocity due to the electric field of $$\vec{v}_E \approx 4(10^5)\vec{a}_r m/s \tag{4}$$

The direction of this velocity is anti-parallel to the E, that is, the electrons move from the cathode outward to the anode.

An electric discharge involves a small volume; it is a thin thread of current. Consequently, the zone of high temperature from an arc discharge is much too small to provide an opportunity for the chemical dissociation of raw materials at a practical scale, unless something is done to extend the ionized region.

One way to increase the region of high temperature and improve the extent of material interaction is to rotate the arc discharge at a high rate. Rotation rates as high as 60,000 rpm or even higher are needed to effect the desired results. Such a rapid rotation transforms the thin discharge thread into a holed disk. The rotation process also would force the electron emission point at the cathode-ball electrode to shift from the point of maximum emissivity, maximum sharpness, to a blunter surface. This would suggest that the thickness of the holed disk of the ionized gas would be greater than the diameter of the thread discharge without rotation, while the density of the ionized particles would decrease. Nevertheless, the ionized region increases with rotation, and the chances that a given particle of raw material will be subjected to high enough temperature for dissociation is increased enormously with the rotating arc. The retention time of the raw materials is also increased, and the stability of plasma is enhanced with rotation.

In the plasma reactor of the present invention, a magnetic field is used to rotate the plasma. A rough estimate of the magnetic field, H, in the gas is obtained from the following calculations using the general expression for a solenoid and typical values for the current, I. in the coils; coil length, L; and number of coil turns, $$N \cdot \vec{H} \approx \frac{NI}{1} \vec{a_z} = \frac{(156)(5)}{(2.5 \text{ in})(2.54)/100} \vec{a_z} = 1.2(10^4)\vec{a_z} A/m \tag{5}$$

The magnetic induction, B, is $$\vec{B} = \mu_o \vec{H} = 4\pi(10^{-7})1.2(10^4)\vec{a_z} = 1.5(10^{-2})\vec{a_z} T \tag{6}$$

The Lorentz equation expresses the force, $\vec{F}$, on a particle of charge, q. moving with velocity $\vec{v}$, in an electric field in magnetic induction:

$$\vec{F} = q(\vec{E} + \vec{v} \times \vec{B}) \tag{7}$$

For a free-moving charged particle with only $\vec{B}$ present, the particle will encircle a B-line under the equilibrium conditions of the second term of the Lorentz force with the countering centrifugal force:

$$q\vec{v} \times \vec{B} + (mv^2/R)\vec{a_r} = 0 \tag{8}$$

The resulting radius of gyration, or gyroradius, is $$R = mv/qB \tag{9}$$

Figure 2:
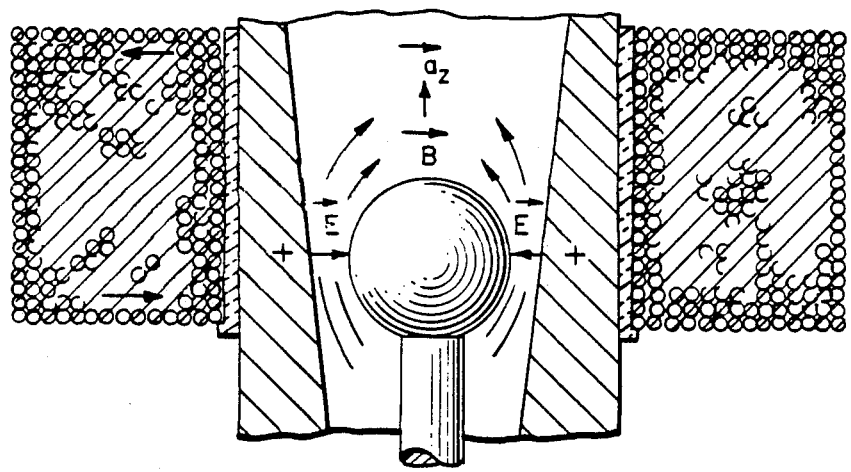
FIG. 2 is a schematic cross section of the plasma reactor shown in FIG. 1 in the region of the magnetic field.
Figure 3:
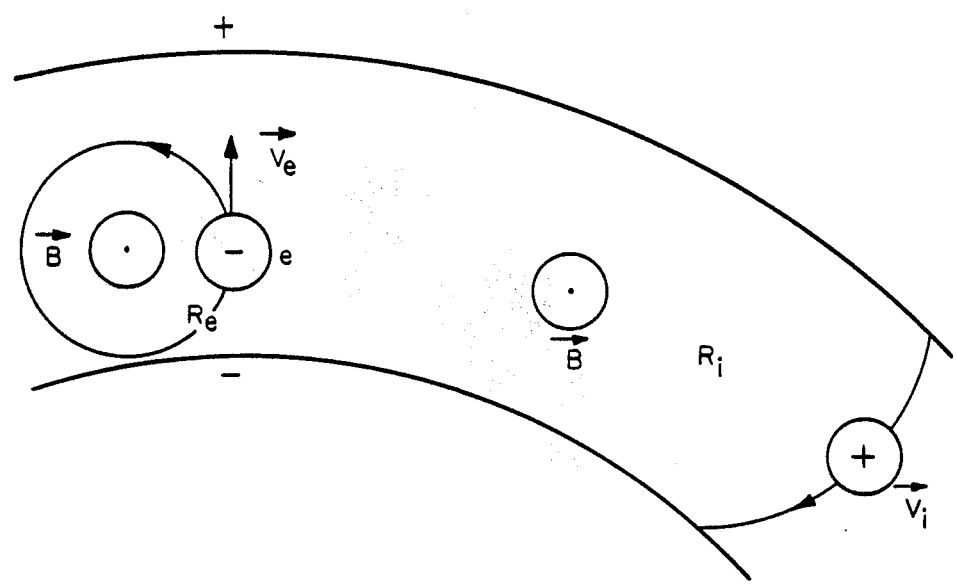
FIG. 3 is a schematic representation of the behavior of electrons and ions under the influence of the plasma reactor depicted in FIG. 1.

A representation of the process and effect of these equations for electrons and ions in the reactor of the present invention is illustrated in FIGS. 2 and 3.

The argon ions are assumed to be singly ionized.

$$R_e = \frac{m_e v_e}{eB} = \frac{9.11(10^{-31})}{1.6(10^{-19})1.5(10^{-2})} v_e = 3.8 (10^{-10}) v_e \tag{10}$$

For the electron speed already determined as 4 ($10^3$) m per s, the corresponding gyroradius is $$R_e = 1.5(10^{-6})m \tag{11}$$

This may be the largest electron gyroradius associated with the total voltage across the cathode-anode gap, and it is much smaller than the gap length. For lower speeds, the free electron would rotate even more closely to the B-line. In any case, the electron is closely coupled to the B-lines.

It is much more difficult to estimate the ion speeds because of their much greater mass. At most, the ion could possibly experience the full gap voltage of 35 V, but most likely it would feel the influence of a much smaller voltage, about 1 V. Assuming direct voltage-kinetic energy relation for simplicity, the argon ion speeds for these two voltages are inset.

$$v_i(35\ V) = 1.3(10^4) m/s \tag{12}$$

$$v_i(1\ V) = 2.2(10^3) m/s \tag{13}$$

The corresponding gyroradii are inset.

$$R_i(35\ V) = 0.36\ m \tag{14}$$

$$R_i(1\ V) = 0.06\ m \tag{15}$$

Since the cathode-anode gap length is about 0.5 cm, the argon ion gyroradii for the two voltages are much larger than the gap. This suggests that the ion path from anode to cathode tends to be flat and that the Lorentz force acts to move the ion in a counterclockwise direction as viewed from the top.

The following arguments are based on single particle orbit theory, which may be appropriate for dense plasmas. There is a tendency for charged particles in dense plasmas to follow individual motions. Attention is given to electrons here rather than to ions because radiation intensity from accelerated particles is inversely proportional to the particles' mass. Thus, an electron with velocity $\vec{v}$ in the presence of a uniform static magnetic induction will circle around its gyrocenter. Its frequency of rotation around the gyrocenter is $$v_b = v/2\pi R = (eB/2\pi m) \tag{16}$$

Usually this is expressed as the electron cyclotron frequency in radians per second:

$$\omega_b = eB/m \tag{17}$$

Since the electron is subjected to accelerations from the inward Lorentz force and the outward centrifugal force, it radiates cyclotron radiation and spirals into its gyrocenter. The radiated energy comes from the electrons' kinetic energy and is emitted with a continuous spectrum of radiated frequencies. Most of the radiated energy is at or near the cylotron frequency. Radiations from the plasma of the present invention were measured with a single-turn coil with a spectrum analyzer. Isolated, well-defined peaks were recorded at 383 MHz. If the value of the magnetic induction from the rough approximation of Equation 6 of 0.015 T is used in Equation 17, the computed electron cyclotron frequency is 419 MHz. This is nine percent greater than the measured value. Consequently, it is presumed that the measured frequency of 383 MHz is the electron-cyclotron frequency from the plasma of the present invention. In fact, the more accurate measurement with the spectrum analyzer provides a better estimate of the magnetic induction of 0.0138 T. This value will be used henceforth.

The presence of an electric field $\vec{E}$ orthogonal to $\vec{B}$ causes the path of the gyrating electron to be distorted. Because of $\vec{E}$, the electron accelerates along the right side of its circle and decelerates along the left side. Consequently, its velocity is greater along the right side than along the left side, and as a result, from Equations 9 and 10, the radius of curvature is greater at the top than it is at the bottom. There is a drift in the gyrocenters to the left from the above action, and this drift velocity is $$\vec{v_d} = \vec{E} \times \vec{B}/B^2 \tag{18}$$

For values typical to the plasma reactor of the present invention the drift velocity is $$\vec{v_d} = 7(10^3)(-\vec{a_r}) \times 1.38(10^{-2})\vec{a_z}/[1.38(10^{-2})]^2 = 5.1(10^5)\vec{a_\phi} m/a \tag{19}$$

Equation 19 above is independent of charge sign and mass, implying that it applies to both electrons and ions which both drift in the same direction. Conditions for the plasma reactor of the present invention are such that instead of straight lateral drift, the plasma particles of the plasma reactor in the invention are constrained to follow a circular path around the cathode ball electrode. This circular motion is similar to cyclotron radiation conditions: there should be a corresponding radiation. In this case, the balance of forces equation based on the drift velocity $$-eE + \frac{mv_d^2}{R_c} a_2 = -e v_d \times B \tag{20}$$

The average radius, $R_c$, of drift motion is fixed by the system at about 0.75 inch, and the frequency of rotation from the cross fields around the cathode ball electrode, which corresponds to the cyclotron frequency, is $$\mu c_c = v_d/2\pi R_c = (E/B)/2\pi R_c \tag{21}$$

using the electric field estimated previously and the spectrum analyzer value for the magnetic induction, the cross field rotation frequency is computed to be 4.2 MHz. According to these arguments, the plasma rotates around the cathode ball electrode at this frequency. There should be consequential radiation from the electrons, just as from the formal cyclotron radiation. Most of the radiated energy will occur at or near the rotational frequency, $\mu c_c$ from Equation 21. A radiation detection system registered clear isolated peaks at 4.2 MHz, the same frequency as the calculated value. This figure indicates that the plasma may rotate around the cathode at a very high rate; at a much greater rate than has been reported by other investigators.

For example, in U.S. Pat. No. 4,394,162, to Tylko, J. K., plasma rotation by means of a magnetic system more complicated than the simple coil of this invention was given as ranging from 1,000 rpm to greater than 60,000 rpm. However, no information was presented as to how these rates were measured.

Although the use of a spectrum analyzer to measure e-m radiations from the plasma may be conclusive, there can be questions raised as to which mechanism in the plasma itself produced the given radiation. Radiations abound from plasmas due to many different sources. Nonetheless, the well-established expression for the drift velocity, see Equation 19 above, is a strong argument in favor of the concept of plasma rotation from cross fields. There may be doubts about the field values used for the drift velocity; however, since the value of the magnetic induction has been estimated from two separate means, it is fairly accurate. This suggests that the value of the electric field as being the value remaining is most questionable. Because the drift velocity and the rate of plasma rotation are proportional to the electric field, the rate of plasma rotation from cross fields can vary from zero up to the maximum value of 4.2 MHz. The spectrum analyzer measured radiations with frequencies as low as hundreds of kilohertz, but the 4.2 MHz was the lowest frequency recorded.

E-m radiation was measured at the frequency calculated from cross fields. Since the radiation comes from accelerated electrons, not from accelerated ions, then it is probably correct to claim that the electrons are rotating around the cathode at a rate of 4.2 MHz. However, electrons could slip by the ions and neutrals at the measured rate following, in part at least, the Lorentz model. Ions could collide with the neutrals and rotate at a slower rate. There is no problem with charge imbalance, because the free electrons would quickly respond to any internal electric field to negate the imbalance. Energy, $E_i$, for the moving ions comes from the electric field of the arc welder used as a generator, and the time required, $t_i$, to gain that energy is short compared to the plasma lifetime (scores of seconds):

$$E_i = N_i[(\tfrac{1}{2})m_i v_d^2] = (0.01)(2.6)(10^{19})[\pi^2(0.5/2)^2(1.5)(2.54)]$$
$$\times \tfrac{1}{2}(40)(1.66)(10^{-27})[5.1(10^5)]^2 = 5,300 \text{ J} \quad (22)$$

$$t_i = E_i/P = 5,300/35(200) = 0.76 \text{ s} \quad (23)$$

Total gap volume and one percent ionization are used in the above equations. The actual plasma volume, including the plasma plume, is much greater than that assumed in Equation 22, but the present ionization in the plasma plume is much smaller than one percent, therefore the two should balance. The plasma may not rotate completely around the cathode-ball electrode before charge particles break off from the counterclockwise rotating motion and migrate to their respective electrodes. However, there should be complete ring-like rotation, because the azimuthal drift speed from the cross fields is greater than the radial drift speed due to the electric field alone.

To summarize the theory of the electromagnetically sustained plasma reactor of the present invention, the plasma electrons probably rotate around the cathode ball electrode at the high rate of rotation of 4.2 MHz, and since the drift velocity from the crossed fields is invariant to charge, plus the fact that sufficient power is supplied to energize the ions, it is very likely that the ions also rotate around the cathode ball electrode at a very high rate. The plasma appears to be stable, which suggests that the rate of revolution is at least as great as 60,000 rpm.

BEST MODE FOR CARRYING OUT THE INVENTION

The preceding theory is implemented by the electromagnetically sustained plasma reactor of the present invention. For convenience, a preferred embodiment of this invention will be described, with reference to a process for refining raw materials in a plasma reactor using argon gas, but the scope of the invention is intended to include not only various raw materials but also various other appropriate inert gases; for example, nitrogen.

As shown by FIG. 1, the plasma reactor of the present invention, designated generally at 2, includes an anode electrode 4 having a cylindrical outer diameter and wall 6. The anode electrode is hollow and the interior wall 8 tapers outwardly and upwardly to form an elongated, frustoconical interior cavity 10. This cavity is closed at the end having the least interior diameter by collector can 12. At the opposite end, that is, the end having the greatest interior diameter, the interior cavity is topped by a cylindrical retainer 18 to form thereby an elongated, generally frustroconical reaction chamber 20. Adjacent to the retainer, the anode electrode, reaction chamber defining wall, is penetrated by a raw material inlet port 22, through which powdered raw material is introduced into the reaction chamber. The collector can 12 is provided with a port 24 for the introduction of an inert gas, at a low pressure, for example argon gas. An electrical connection 26 for the positive electrical lead 28 to the anode electrode is held in place by a tapscrew 30 and may be located as is convenient on the exterior wall thereof.

Circumferentially about the exterior wall of the anode electrode and between the opposed ends of the interior reaction chamber formed therein, the reactor 2 is provided with coil 32. The coil is spaced from the cylindrical outer wall of the anode electrode by a layer of thermal insulation 34 to ensure that coil temperature does not become excessive. The coil is a wire, solenoidal, magnetic coil, which when energized provides an upwardly directed magnetic induction. During reactor operation, since the electrical discharge consists of charged particles in motion, it reacts to a magnetic field. The induction provided by the coil causes rapid rotation of the arc and plasma, possibly in the megahertz range, thereby expanding the reaction zone, increasing plasma stability, and helping to cool the reactor walls.

The reactor of the present invention is provided with an upstanding, elongated cathode stem 36, extending through the collector can and into the reaction chamber 20. The cathode stem is the contact for a negative electric contact at 38 and acts to remove heat during reactor operation. A cathode-ball electrode 40 is attached to the end of the stem within the reaction chamber and spaced from chamber walls to provide electrode gap 41. The cathode-ball electrode is spherical, may be formed of stainless steel, and is attached to the cathode stem for rotation therewith. Bearings 42 support and align the stem for free rotation; mechanical rotation of the stem and cathode ball is effected by pulley means 44 attached to the stem. Mechanical rotation, at a few hundred revolutions per minute, is too slow for plasma rotational purposes, but does help to align the cathode ball with the reaction chamber center line and assists in heat dissipation. For electrical and heat insulation, the stem is circumferentially wrapped with insulation of glass-wool mesh and tape 46 for a portion of its length.

The anode electrode is adjustably supported about the cathode-ball electrode by a bar 48 attached to a rack and gear arrangement 50. The rack and gear provide for vertical raising and lowering of the anode along the reaction chamber central longitudinal axis so that the electrode gap 41 may be increased or decreased by the rack and gear arrangement. This variability of the electrode gap provides easy and rapid plasma ignition, control over the extent of the plasma, and easy, controllable extinguishing of the plasma reaction.

The reaction chamber 20 defined by the anode electrode has three general zones or areas: a quenching zone 54, a reaction zone 56, and a plasma plume area 58. Most closely adjacent to the collector can 12, where the reaction chamber has the least diameter, lies the quenching zone 54. Relatively cool temperatures in the quenching zone are provided by the introduction and upflow of the inert gas through port 24. The can itself acts as a collector for refined heavy product materials and as a plenum for the inert gas provided through the port.

At the opposite, upper end of the reaction chamber is the plasma-plume area 58. The plasma-plume is formed due to the upward flow of the inert gas. Raw material, introduced through port 22, is pre-heated in this area and some reactions may occur in the plume area.

Between the quenching zone and the plume area lies the reaction zone 56 in which the electric arc discharge occurs. In this area plasma concentration is maximized, temperature is highest and the chemical reactions are greatest or most numerous. In the reaction zone, but substantially between the reaction zone and the quenching zone and adjacent the cathode ball, there is provided an insulated sparking wire 60. Arc breakdown in the reaction zone, ultimately between the cathode ball and the anode, is initiated by providing through the sparking wire and between the wire and the cathode ball, a high voltage of about 4,000 V.

OPERATION OF THE REACTOR

Within the reaction chamber 20 of the reactor of the present invention and between the two electrodes, anode 4 and cathode-ball 40, an electrical discharge arc, initiated by sparking wire 60 and sustained by a commercially available arc welder generator of a well-known type (not shown) is to be produced. An arc welder generator is selected as the power source because of its ability to provide the necessary large amounts of current, about 200 A, for a continuously sustained period of time.

The arc will be limited to a small region if it proceeds only under its natural process. However, since the arc consists of charged particles in motion, it will react to a magnetic field and will rotate, expanding in the reaction zone 56. The source of the magnetic field is solenoid coil 32, in which full-wave rectified current flows. Coil current may be supplied by a conventional battery charger (not shown). After the plasma is well established, the anode may be adjusted downwardly by rack and gear arrangement 50, thereby increasing the electrode gap 41 and the overall plasma region.

Powdered or particulate material to be dissociated is fed into the reactor of the present invention through port 22. The peripheral entry tends to more evenly distribute the input materials. After the particulate material enters the reaction chamber, it descends under the influence of gravity against rising, slightly pressurized inert gas, into the magneto-plasma plume area 58 and into the reaction zone 56. The inert gas under slight pressure acts to levitate the raw material, increasing the time spent in the reaction zone.

Due to the high temperature in the reaction zone, for example, a temperature in the range of about 10,000° K., the particulate matter is freed of contamination or other materials by evaporation. While the material remains inside the plasma reaction zone 56, a floating potential is imposed on the surface of the now molten material. As a result of the magnetic field imposed by coil 32, an equal ion and electron current bombards the surface of the material droplets. Practically all of the kinetic energy of the electrons of the rotating plasma is converted into heat which enables the temperature to be raised higher than the material melting temperature. This high temperature causes the material and contaminants therein to break down and the material is molecularly dissociated from impurities with which it is chemically or physically mixed. As it falls through the reaction zone and enters the quenching zone, the refined material is cooled and, finally, is collected in the collector can 12.

A modification within the scope of the present invention might include providing associated electromagnetic radiation protection means for measurements relative to the plasma electrons rotating about the cathode. A second modification might be to provide water-cooled anode and cathode electrodes for maintaining temperature at an acceptable level during continuous operation of the reactor. These and other changes or modifications are not beyond the scope of the present invention.

INDUSTRIAL APPLICABILITY

In the metallurgical and other refining industries, particularly extractive industries, it is frequently necessary to refine difficult-to-reduce ores and materials and reactors producing high temperatures are commonly used to do so. The magnetically sustained plasma arc reactor of the present invention efficiently produces the high temperatures required to refine such material. Magnetically induced rotation of an arc plasma in accordance with the present invention produces a more stable plasma and increased retention time of the raw material in the plasma. The variably positionable electrodes of the reactor of the present invention permit rapid, easy plasma ignition and better control over the plasma reaction. The simple, straightforward design, increased efficiency, and easy scale-up of the present invention provide the potential for industry-wide application and will result in a more efficient refining industry.

What is claimed is:

1. A plasma arc reactor for refining raw materials comprising:

spaced electrode means including at least one anode electrode defining a reaction chamber and at least one cathode electrode mounted within said reaction chamber and variably spaced from said anode electrode;

electrical circuit means connected to said anode and cathode electrodes for creating a plasma arc within said reaction chamber;

and an induction coil means externally mounted circumferentially about said reaction chamber for producing a magnetic field therein.

2. The plasma arc reactor of claim 1, wherein said anode electrode comprises a hollow elongated cylinder having a central vertical longitudinal axis and opposed first and second closed ends.

3. The plasma reactor of claim 2, wherein said anode electrode defines a reaction chamber comprising a frusto-conical interior cavity.

4. The plasma reactor of claim 2, wherein said reaction chamber comprises a frusto-conical interior cavity which tapers from a small interior diameter at said first end to a larger interior diameter at said second end.

5. The plasma reactor of claim 4, wherein said reactor includes support means secured to said anode electrode, said support means operating to move said anode electrode along the longitudinal axis thereof relative to the cathode.

6. The plasma arc reactor of claim 1, wherein said induction coil means operates to impose a magnetic field within said reaction chamber to rotate said plasma arc.

7. The plasma arc reactor of claim 3, wherein said induction coil means operates to impose a magnetic field within said reaction chamber to rotate said plasma arc produced between said anode electrode and said cathode electrode.

8. The plasma arc reactor of claim 7, wherein said cathode electrode comprises a spherical, cathode ball electrode spaced from said anode electrode within said reaction chamber.

9. The plasma arc reactor of claim 8, wherein said reactor incudes support means secured to said anode electrode, said support means operating to move said anode electrode along the longitudinal axis thereof relative to said cathode ball electrode.

10. The plasma arc reactor of claim 9, wherein said cathode ball electrode is mounted within said reaction chamber, on a cathode stem, said cathode stem extending out said first closed end of said reaction chamber.

11. The plasma arc reactor of claim 10, wherein said cathode stem is rotatably mounted to allow rotation of said cathode ball electrode within said reaction chamber.

12. The plasma arc reactor of claim 1, wherein said plasma sustaining gas is an inert gas.

13. The plasma arc reactor of claim 12, wherein said reactor includes means for admitting said gas to said reaction chamber in a flow counter to the force of gravity.

* * * * *

UNITED STATES PATENT AND TRADEMARK OFFICE
CERTIFICATE OF CORRECTION

PATENT NO. : 4,745,338

DATED : MAY 17, 1988

INVENTOR(S) : Daniel L. HOLLIS, Jr. ET AL

It is certified that error appears in the above-identified patent and that said Letters Patent is hereby corrected as shown below:

Column 1, line 51, delete "is yet a" and insert therefor --are yet--.

Column 1, line 52, delete "problem" and insert therefor --problems--.

Column 2, line 39, after "neutral" insert --(possibly)--.

Column 3, line 12, delete "are" and insert therefor --is--.

Column 3, line 13, delete "are" and insert therefor --is--.

Column 3, line 17, delete "a function" and insert therefor --functions--.

Column 3, line 34, delete "(a.C. or d.c.)," and insert therefor --(a.c. or d.c.),--.

Column 3, line 43, delete "a" and insert therefor --$\vec{a}$--.

Column 3, line 57, after "is" insert --in--.

UNITED STATES PATENT AND TRADEMARK OFFICE
CERTIFICATE OF CORRECTION

PATENT NO. : 4,745,338

DATED : MAY 17, 1988

INVENTOR(S) : Daniel L. HOLLIS, Jr. ET AL

It is certified that error appears in the above-identified patent and that said Letters Patent is hereby corrected as shown below:

Column 4, line 21, delete "$\vec{v}_E$" and insert therefor --$\vec{v}_E$--.

Column 4, line 23, delete "E," and insert therefor --$\vec{E}$,--.

Column 4, line 56, delete "." and insert therefor --,--.

Column 4, line 60, delete "N:".

Column 4, line 62, delete "is" and insert therefor --in tesla, T, is--.

Column 5, line 2, delete "$\vec{v}$" and insert therefor --$\vec{v}$--.

Column 5, line 9, delete in its entirity and insert therefor --$q\vec{v} \times \vec{B} + (mv^2/R)\vec{a}_r = 0$ \qquad (8)--.

Column 5, line 12, delete "$\nu$" and insert therefor --v--.

Column 5, line 21, delete "$\nu_e$" (first, second and third occurrences) and insert therefor --$v_e$--.

UNITED STATES PATENT AND TRADEMARK OFFICE
CERTIFICATE OF CORRECTION

PATENT NO. : 4,745,338

DATED : MAY 17, 1988

INVENTOR(S) : Daniel L. HOLLIS, Jr. ET AL

It is certified that error appears in the above-identified patent and that said Letters Patent is hereby corrected as shown below:

Column 5, line 42, delete "$v_i$" and insert therefor --$v_A$--.

Column 5, line 44, delete "$v_i$" and insert therefor --$v_A$--.

Column 5, line 68, delete "$v$" and insert therefor --$v$--.

Column 6, line 39, delete "$\vec{v}_d$" and insert therefor --$\vec{v}_d$--.

Column 6, line 44, delete "$\vec{v}_d$" and insert therefor --$\vec{v}_d$--.

Column 6, line 45, delete "$a_z$" and insert therefor --$\vec{a}_z$--.

Column 6, line 45, delete "a" (last occurrence) and insert therefor --s--.

Column 6, line 60, delete "$mv_d^2$" and insert therefor --$mv_d^2$--.

Column 6, line 60, delete "$v_d$" (second occurrence) and insert therefor --$v_d$--.

UNITED STATES PATENT AND TRADEMARK OFFICE
CERTIFICATE OF CORRECTION

PATENT NO. : 4,745,338

DATED : MAY 17, 1988

INVENTOR(S) : Daniel L. HOLLIS, Jr. ET AL

It is certified that error appears in the above-identified patent and that said Letters Patent is hereby corrected as shown below:

Column 6, line 67, delete "$\mu C_c = v_d /$" and insert therefor --$v_c = v_d /$--.

Column 7, line 1, delete "using" and insert therefor --Using--.

Column 7, line 3, delete "cross" and insert therefor --crossed--.

Column 7, line 9, delete "$\mu C_c$" and insert therefor --$v_c$--.

Column 7, line 29, delete "cross" and insert therefor --crossed--.

Column 7, line 33-34, delete "remaining is".

Column 7, line 36, delete "cross" and insert therefor --crossed--.

Column 7, line 42, delete "cross" and insert therefor --crossed--.

Column 7, line 58, delete "$v_d^2$" and insert therefor --$v_d^2$--.

UNITED STATES PATENT AND TRADEMARK OFFICE
CERTIFICATE OF CORRECTION

PATENT NO. : 4,745,338
DATED : MAY 17, 1988
INVENTOR(S) : Daniel L. HOLLIS, Jr. ET AL It is certified that error appears in the above-identified patent and that said Letters Patent is hereby corrected as shown below:

Column 8, line 1, delete "charge" and insert therefor --charged--.

Column 8, line 61-62, delete "an upwardly" and insert therefor --a longitudinally--.

Column 9, line 16, after "but" insert --it--.

Column 9, line 53, after "adjacent" insert --to--.

Column 11, line 26-27, delete "frusto-conical" and insert therefor --frustoconical--.

Column 11, line 29, delete "frusto-conical" and insert therefor --frustoconical--.

Signed and Sealed this

Fifteenth Day of November, 1988

*Attest:*

DONALD J. QUIGG

*Attesting Officer*  *Commissioner of Patents and Trademarks*